United States Patent
Vogt

(10) Patent No.: US 7,683,324 B2
(45) Date of Patent: Mar. 23, 2010

(54) BOLOMETER

(75) Inventor: Holger Vogt, Muehlheim an der Ruhr (DE)

(73) Assignee: Fraunhofer-Gesellschaft zur Foerderung der angewandten Forschung e.v., Munich (DE)

(*) Notice: Subject to any disclaimer, the term of this patent is extended or adjusted under 35 U.S.C. 154(b) by 0 days.

(21) Appl. No.: 12/282,215

(22) PCT Filed: Mar. 14, 2006

(86) PCT No.: PCT/EP2006/002326

§ 371 (c)(1),
(2), (4) Date: Sep. 17, 2008

(87) PCT Pub. No.: WO2007/014328

PCT Pub. Date: Sep. 20, 2007

(65) Prior Publication Data

US 2009/0084958 A1     Apr. 2, 2009

(51) Int. Cl.
*G01J 5/20*     (2006.01)
(52) U.S. Cl. .................. 250/338.4; 250/338.1
(58) Field of Classification Search .............. 250/338.1, 250/338.4
See application file for complete search history.

(56) References Cited

U.S. PATENT DOCUMENTS

| 6,441,374 B1 * | 8/2002 | Kawano et al. ........... 250/338.1 |
| 7,247,850 B2 * | 7/2007 | Laou et al. ................ 250/332 |
| 2006/0060784 A1 * | 3/2006 | Moon et al. .............. 250/338.1 |

FOREIGN PATENT DOCUMENTS

WO    WO 2007054111 A1 *  5/2007

OTHER PUBLICATIONS

Official communication issued in International Application No. PCT/EP2006/002326, mailed on Sep. 11, 2006.
Nevzil et al.: "Micromachined Bolometer With Single-Crystal Silicon Diode as Temperature Sensor," IEEE Electronic Device Letters; vol. 26, No. 5; May 2005; 320-322.
Pfeiffer et al: "Controlled P-Doping of Pigment Layers by Cosublimation: Basic Mechanisms and Implications for Their Use in Organic Photovoltaic Cells," Solar Energy Materials & Solar Cells; XP-004201249; Jun. 2000; pp. 83-99.

* cited by examiner

Primary Examiner—David P Porta
Assistant Examiner—Casey Bryant
(74) Attorney, Agent, or Firm—Keating & Bennett, LLP

(57) ABSTRACT

Bolometers utilize an organic semiconductor diode layer assembly for temperature measurement. These bolometers are particularly sensitive to the infrared wave range so that they are employable as infrared sensors and may be combined to form one-dimensional sensor rows or two-dimensional microbolometer arrays.

19 Claims, 3 Drawing Sheets

BOLOMETER

BACKGROUND OF THE INVENTION

The present invention relates to a bolometer.

A bolometer is a device for measuring electromagnetic radiation of a certain frequency. It includes an absorber, which converts the electromagnetic radiation to heat, and a thermometer. In dependence on a thermal capacity of the material, there is a direct connection between a quantity of absorbed radiation and a resulting increase in temperature. Therefore, the temperature may serve as a measure for an intensity of incident radiation. What is of particular interest is bolometers for measuring infrared radiation, where most bolometers exhibit a maximum of sensitivity.

In engineering, a bolometer may be used as an infrared sensor, an image sensor for infrared binoculars, an infrared camera or a thermal image camera. Bolometers may be employed as an individual sensor or may be combined to form a sensor row and a two-dimensional array (microbolometer array).

In the sensor, a thin layer is arranged in a thermally insulated manner, e.g. suspended in the form of a membrane. The infrared radiation is absorbed in this membrane, which raises its temperature as a result. If this membrane consists of a material with a finite electric resistance, this electric resistance will change depending on the temperature rise and a temperature coefficient of the resistance. Further details are described in the following document: http://www-leti.cea.fr/commun/AR-1403/T5-Photodetection/25-J-Ltissot.pdf. Alternatively, the membrane is an insulator (silicon oxide or silicon nitride), onto which the resistor was deposited as a further thin layer. In other embodiments, insulation layers and an absorber layer are applied in addition to the resistor layer.

For the sensitivity of the bolometer, it is important that the electric resistance change rapidly and significantly along with the temperature. The temperature dependence of metal layer resistors is linear. Semiconductors used as resistor material exhibit exponential dependence. Dependence of the same magnitude may be expected from diodes used as thermal detectors, which have a current-voltage characteristic curve according to:

$$I_D = I_0 \cdot (\mathrm{Exp}\{eU_D/kT\} - 1),$$

wherein T is the temperature, k is the Boltzmann constant, e is the electric charge, $I_D$ and $U_D$ designate a current intensity and voltage in the diode, and $I_0$ is a voltage-independent constant.

Bolometers arranged in rows or arrays are nowadays typically fabricated on silicon substrates by means of surface micromechanics using methods of microsystem engineering. The reference here is to microbolometer arrays.

A wavelength of the infrared radiation to be detected ranges from 8-14 µm, as in this wavelength range, there are radiating solids having approx. room temperature (300 K). The wavelength range of 3-5 µm is also of interest because of the diaphanous atmospheric window.

FIG. 3 exemplarily shows a bolometer. It includes a thermometer layer of amorphous silicon, which is stretched as a membrane between two spacers 820 and 830 at the corners thereof. Below this membrane, a reflector layer 840 is positioned at a distance of approx. 2.5 µm. The thermometer layer, or membrane, has a thickness of approx. 0.1 µm. The spacers 820 and 830 do not only fix the membrane 810 above the reflector layer 840 on opposite sides, but also establish an electrical contact between the respective end of the thermometer layer 810 and an underlying circuit (not shown), such as e.g. to a readout integrated circuit (ROIC) via a metal pad. For obtaining maximum thermal sensibility, the thermometer layer 810 is, at the suspended ends, formed such that it is connected to the spacers via narrow portions 850 and 860, so that thermal insulation of the thermometer layer 810 may be achieved.

Compared to other (photonic) infrared detectors, it is a substantial advantage of thermal bolometers that they may be operated at room temperature, that is without cooling.

Good diodes based on anorganic semiconductor materials may as yet only be fabricated in monocrystalline silicon, not, however, in amorphous silicon or other semiconductor materials hitherto employed in a bolometer (vanadium oxide, amorphous or polycrystalline Si, Ge or SiGe). The use of monocrystalline silicon on a thermally insulated membrane is possible e.g. by a silicon-on-insulator technique or by undercutting diodes in the silicon substrate. These techniques are described in: T. Ishikawa et al.: "Performance of 320×320 Uncooled IRFPA with SOI Diode Detectors", Proc. SPIE, vol. 4130, pp. 152-159, (1400), or in: P. Neuzil, Y. Liu, H.-F. Feng, and W. Zeng: "Micromachined Bolometer with Single-Crystal Silicon Diode as Temperature Sensor", IEEE Electron. Dev. Letters, vol. 26, no. 5, May 2005, pp. 320-322.

Drawbacks of the existing technology include, for example, that, in the use of anorganic semiconductor materials, active (CMOS) control and amplifier elements may not be integrated underneath the sensor structure. Co-integrating these elements next to the detector, which might be possible, will result in a drastic reduction of the filling factor (detector area versus total area), thereby raising the chip area and the detector cost. In addition, these structures may not be used for fabricating an absorber having a resistor layer amounting to the spreading resistance of an electromagnetic wave in air (377 Ω/□) and being arranged above a reflector at a distance of λ/4 (of approx. 2.5 µm, at a wavelength of 10 µm).

In the paper: J.-J. Brissot, F. Desvignes, and R. Martres: "Organic Semiconductor Bolometric Target for Infrared Imaging Tubes", IEEE Trans. Electron. Dev., vol. 20, no. 7, July 1973, pp. 613-620, (1973), a bolometric target from an undoped organic semiconductor is utilized as a temperature-dependent resistor in an infrared vidicon.

The use of undoped organic semiconductor layers as used in the paper just cited, in turn involves the drawback that this layer has a very high impedance ($10^{14}$ Ωcm at 70° C.) and both sides are contacted extensively.

SUMMARY

An embodiment may have: a bolometer with an organic semiconductor diode layer assembly for temperature measurement, the organic semiconductor diode layer assembly having a layer sequence of a first contact layer, a p-conducting organic semiconductor layer, an n-conducting organic semiconductor layer as well as a second contact layer, wherein the second contact layer is connected to a first spacer and the first contact layer is connected to a second spacer, the two spacers supporting the organic semiconductor diode layer assembly above a substrate in a floating manner and being conductive in order to establish an electrical connection to an integrated circuit located within the substrate, and the organic semiconductor layers being insulated from both spacers.

A bolometer according to the present invention includes an organic semiconductor diode layer assembly for temperature measurement. These diodes may be extensive, e.g. have a size of several mm², which is why, even with small array pixels having a membrane area of approx. 25×25 µm², high yield may be achieved. Furthermore, good diodes with an ideally shaped characteristic curve, that is with a large range of an exponential current rise, may be fabricated, as has already been realized in the context of organic light-emitting diodes (OLED), for example.

An inventive bolometer also has the advantage of exhibiting a large range characterized by exponential temperature dependence in the current-voltage characteristic curve and still having low electric resistance. In addition, it enables a high filling factor, wherein the pixel size may be realized small enough for realizing two-dimensional arrays.

In recent years, manufacturers have been able to fabricate organic semiconductors in a quality permitting use thereof in microelectronics and in microsystem engineering. Fields of application investigated include "plastic transistors", i. e. integrated circuits in organic semiconductors, and in particular also OLEDs. The p-n junctions in organic semiconductors have hitherto advantageously been utilized for the generation of light (optic LEDs, OLEDs). The typical forward voltage of such a diode lies above 2 volts. These diodes are fabricated with large areas in the form of a multilayer system, with reference be made to D. Gebeyehu, K. Walzer, G. He, M. Pfeiffer, K. Leo, J. Brandt, A. Gerhardt and H. Vestweber: "Highly efficient deep-blue organic light emitting diodes with doped transport layers", Synthetic Metals 148 (2), pp. 205-211 (2005). However, it is also possible to fabricate planar diodes having forward voltages of under 1 volt, the current-voltage characteristic curve of which is very similar to that of a silicon diode, where, here, reference be made to U.S. Pat. No. 6,812,638 B2.

The organic semiconductor diode layers may be manufactured out of small molecules by vapor depositing or out of polymers by application by spinning or else by printing processes similar to those in inkjet printers. They are highly pure and may be patterned, where reference be made here to M. Pfeiffer, S. R. Forrest: "Organic Light Emitting Diodes", in: R. Waser (Ed.), Nanoelectronics and Information Technology, Advanced Electronic Materials and Novel Devices, Wiley VCH (2003), and T. Kawase et al.: "All-Polymer Thin Film Transistors Fabricated by High-Resolution Inkjet Printing", Proc. IEDM, 623-626 (2000). In the meantime, OLEDs that are already long-term stable, have also been described, such as in P. Wellmann et al: "High-efficiency p-i-n organic light-emitting diodes with long lifetime", Journal of the SID 13/5, pp. 393-397 (2005). In particular, the resistance of organic semiconductor diodes may be adjusted by suitable p- or n-dopings, in which regard reference is made to "M. Pfeiffer et al.: "Doped organic semiconductors: Physics and application in light emitting diodes", Organic Electronics vol. 4, pp. 89-103 (2003). By means of the doping of an organic semiconductor, a drastic reduction of the resistance thereof, e.g. in phtalocyanine, from $10^{10}$ Ωcm to $10^{3}$ Ωcm after doping with 1% of $F_4$-TCNQ (tetrafluorotetracynoquinodimethane), may be achieved, with regard to which reference is made to the last paper cited. As a result, these layers may be contacted in a low-impedance manner, e.g. with ITO (indium-tin-oxide) or with aluminum.

In an embodiment, the p-doped layer is electrically connected to a spacer via a contact layer, and the n-doped layer is electrically connected to a second spacer via a further contact layer. The two spacers serve as electrical connections and support the organic semiconductor diode layer such that same floats over e. g. a reflector at a distance of λ/4. If need be, the contact between the semiconductor layer and the spacer may also be effected in a direct and/or immediate manner. One possible layer sequence is nitride—lower contact layer—organic semiconductor diode—upper contact layer—organic protective layer, for example. The organic supports and protective layers consist of polyimide, parylene or BCB (benzocyclobutene), for example. The organic semiconductor layer consists of p- and n-doped pentacene, anthracene, pthalocyanine or bathophenanthroline, for example, with an undoped intermediate layer, if need be.

This layer sequence is, advantageously by means of the spacers, retained at a fixed distance above the substrate, on which a reflector may be positioned. In the ideal case, the semiconductor layer assembly and the reflector combine to form a λ/4 absorber. This is the case when the distance between the layer sequence and the reflector just amounts to a quarter of the wavelength of the interfering and/or detected IR radiation, wherein the electric resistance of the semiconductor layer assembly advantageously corresponds to the spreading resistance of an electromagnetic wave in air.

In a further embodiment, the layer sequence includes the following 7 layers: one ITO contact, one p-doped hole transport layer, one electron barrier layer, one emission layer, one hole barrier layer, one n-doped electron transport layer and one contact layer of aluminum.

Compared to known diode structures made of silicon, organic diodes possess a number of advantages. As, hitherto, they have primarily been designed for light emission on large areas, reckoning with good yield in the use in a bolometer array with small pixels is also justified. The thermal conductivity and thermal capacity of organic layers is typically less than that of semiconductors and metals, so that better thermal insulation is achievable. Like all diodes, they exhibit an exponential dependence of the current-voltage characteristic curve on the temperature, and therefore, compared to metal-based resistor layers, exhibit a high temperature dependence of the differential resistance.

The long-term stability of the organic layer will be better than in OLEDs, as the sensors are in most cases built in an evacuated housing anyway, for reasons of thermal insulation. Degradation by oxygen or humidity is therewith avoided. Apart from that, underneath the diode membrane, the pixel electronics may be integrated into the silicon substrate, for example, as the low temperature deposition does not affect the pixel electronics of the organic semiconductor layers, which is e. g. configured in the form of CMOS electronics. Thereby, organic semiconductor diodes differ from known diode structures out of silicon, which are hard to integrate in a substrate already having integrated electronics, therefore not being able to offer any suitable space for the integration of a circuit above the sensor layer.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
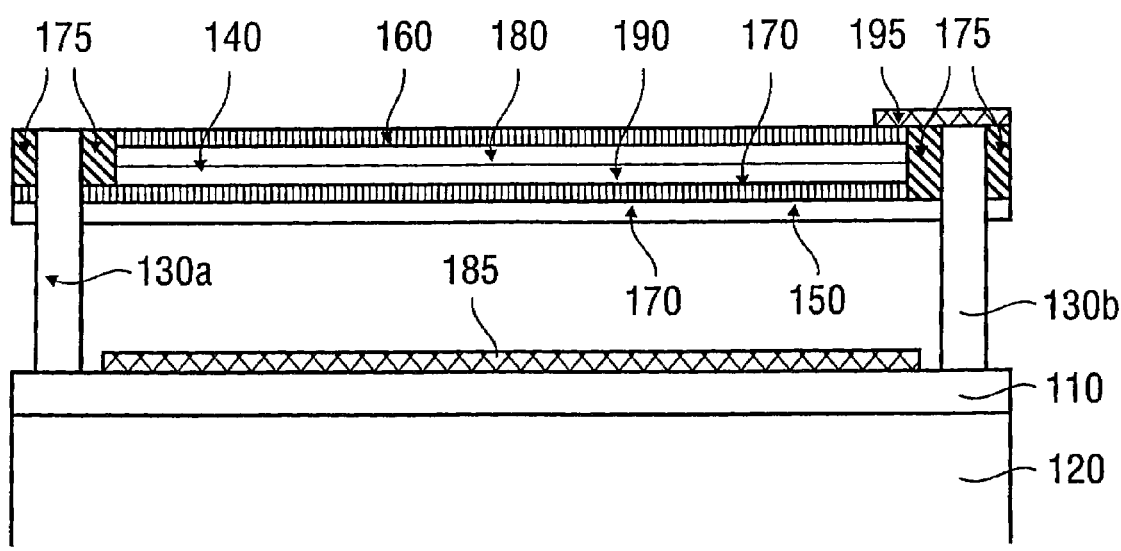
FIG. 1 shows a cross-sectional view of a bolometer according to an embodiment of the present invention.
Figure 3:
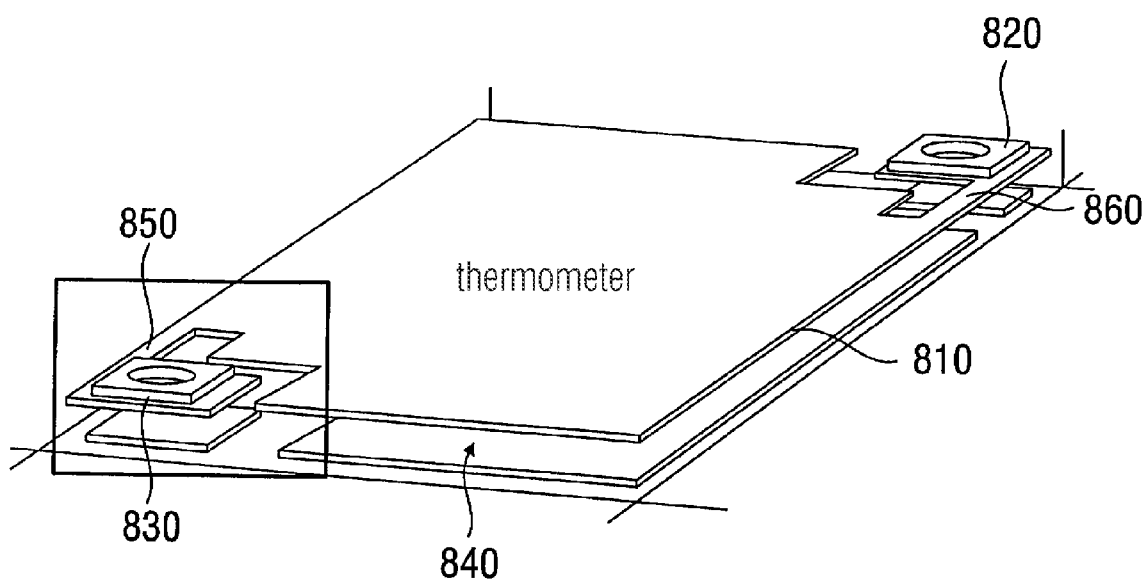
FIG. 3 shows a spatial view of a conventional membrane with amorphous silicon.

In the embodiment of FIG. 1 described in the following, as opposed to the structure of FIG. 3, the membrane is replaced by a layer arrangement of silicon nitride and/or silicon oxide as a non-conducting support, on which a p-n or p-i-n diode is disposed as a multilayer system of organic semiconductor layers.

In the bolometer of FIG. 1, a planar non-conducting background 110, e.g. a layer of silicon oxide, is provided on a substrate such as a silicon wafer 120, for example. The layer 110 may be the polished top oxide layer on a CMOS wafer, for example, which contains all layers and structures needed for a CMOS circuit underneath the surface, wherein the CMOS circuit forms evaluation electronics of the bolometer, for example.

Two spacers 130 project from the non-conducting background 110 and support a membrane 140 at their ends facing away from the substrate 120. By being suspended between the two spacers 130, the membrane 140 is therefore located above the background 110 in a cantilevered manner. However, the spacers 130 do not only serve for fixing the membrane 140 but also as electrical connections for an organic diode formed in the membrane, such as, e.g., for the connection to above-mentioned evaluation circuit, which may be located, in the form of a CMOS circuit, below the membrane 140, for example, which is why the spacers will in the following also be referred to as contact plugs. They may be made of CVD tungsten (CVD =chemical vapor deposition), for example. The contact plugs impart mechanical support to the membrane by puncturing and retaining a nitride layer 150 having a thickness of e.g. 100 to 300 nm, which is provided in the membrane 140. The latter serves for thermal insulation and supports contact layers 160, 170 and organic semiconductor layers 180, 190, which are also part of the membrane. By the distance to the substrate 110 (approx. 0.5 to 3 µm), the membrane 140 is thermally insulated from the substrate. In detail, the membrane 140 is constructed of the nitride layer 150, on which, in turn, lies a first contact layer 170, made e.g. of ITO, which makes planar contact to the following p-conducting organic semiconductor layer 190. Thereon, in turn, the n-conducting semiconductor layer 180 is disposed, which is followed by the second contact layer 160, which is made of e.g. Al, in order to contact the n-conducting organic semiconductor layer in a planar manner. The organic semiconductor layers are insulated from both spacers by an organic insulator 175, for example. The lower contact layer 170 is electrically connected to the spacer 130a, and a contact metal 195 bearing on the plug 130b and the contact layer 160 electrically connects the second contact layer 160 to the other spacer 130b.

The spacers 130 may, as mentioned above, be made of CVD tungsten, for example, and have an exemplary diameter of approx. 1 µm. Same serve to electrically contact the membrane 140 at two opposite points. Below, the spacers are connected to the above-mentioned evaluation circuit via vias through the layer 110, for example.

In the embodiment shown in FIG. 1, a reflective layer 185 of aluminum (with a thickness of approx. 140 nm) is disposed on the oxide surface 110. In the ideal case, there is a distance between the membrane and the reflector, so that a $\lambda/4$ absorber is produced. For this purpose, the organic semiconductor layer of the membrane has an electric resistance of approx. 377 $\Omega/\square$ and is disposed above the reflective layer 185 at a distance of $\lambda/4$ (that is approx. 2.5 µm). This makes this assembly an infrared absorber, and the layer resistance corresponds to the wave resistance of electromagnetic radiation in air. Thus, the infrared signal is optimally absorbed.

Figure 2:
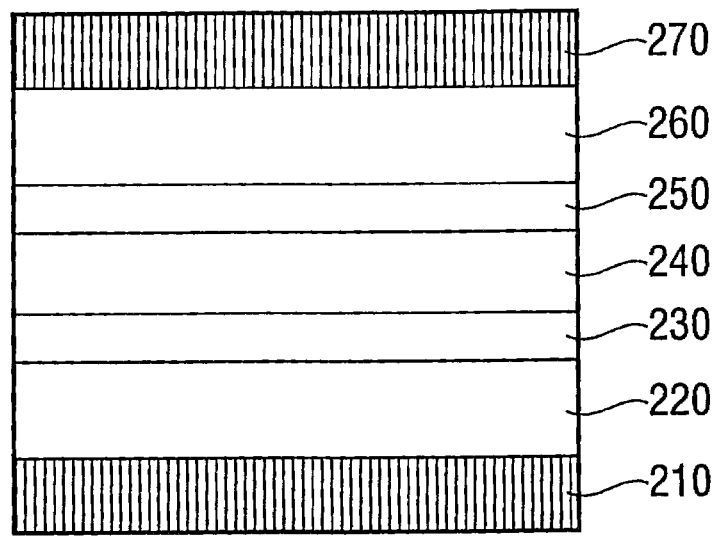
FIG. 2 shows a cross-section of a further embodiment, in which the layer sequence was modified.

In FIG. 2, a cross-section of an exemplary layer sequence for the membrane is shown, which comprises an organic semiconductor having a more complex structure. According to FIG. 2, the membrane is constructed, from bottom to top, of the following 7 layers: ITO contact 210, p-doped hole transport layer 220, electron barrier layer 230, emission layer 240, hole barrier layer 250, n-doped electron transport layer 260 and aluminum 270. The ITO layer 210 would be electrically connected to the plug 130a, while the Al layer 270 would be electrically connected to the plug 130b, and the remaining layers 220-260 would be insulated from the plug 130a,b by means of the insulation material 175. Other organic diode layer sequences may of course also be used.

In further embodiments, the nitride layer 150 may be replaced by a sequence of silicon oxide and silicon nitride layers, for example, or the membrane 140 may exclusively consist of semiconducting organic materials. With suitable stability of an organic support, the following layer sequence is also possible: organic support—organic semiconductor—organic protective layer. Apart from that, an additional absorber layer, such as of Pt black, may also be deposited on the sensor of FIG. 1. The spacers 130 may also be made of another material, such as aluminum or a heavily doped silicon.

With increasing application in thin film electronics (e.g. in TFTs) and optoelectronics (e.g. in OLED), a variety of new material combinations also suitable for use in inventive bolometers will emerge. Organic chemistry allows a virtually unlimited diversity of combinations.

In conclusion, it should not go unnoticed that the aluminum contact layer 160 may be deposited on the layer 180 with its full area. However, depositing in the form of a finger pattern may be of advantage so as to enhance absorption. In the latter instance, the contact layer 160 will only take up a portion of the lateral surface of the bolometer. Similar considerations also apply to the lower contact layer.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A bolometer with an organic semiconductor diode layer assembly for temperature measurement, comprising a reflective layer arranged at a given distance with respect to the semiconductor diode layer assembly, wherein the organic semiconductor diode layer assembly comprises a layer sequence of a first contact layer, a p-conducting organic semiconductor layer, an n-conducting organic semiconductor layer as well as a second contact layer, and wherein the second contact layer is connected to a first spacer and the first contact layer is connected to a second spacer, the two spacers supporting the organic semiconductor diode layer assembly above a substrate in a floating manner and being conductive in order to establish an electrical connection to an integrated circuit located within the substrate.

2. Bolometer of claim 1, wherein the given distance is equal to a quarter of an infrared wavelength.

3. Bolometer of claim 1, wherein the organic semiconductor diode layer assembly is absorbent of a wavelength of electromagnetic radiation and the given distance is equal to a quarter of this wavelength.

4. Bolometer of claim 1, wherein the semiconductor diode layer assembly is suspended above a substrate in a floating manner by means of spacers.

5. Bolometer of claim 1, wherein the organic semiconductor diode layer assembly comprises a nitride layer.

6. Bolometer of claim 1, wherein the organic semiconductor diode layer assembly comprises doped organic semiconductor material.

7. Bolometer of claim 1, wherein the organic semiconductor diode layer assembly comprises a Pt black layer.

8. Bolometer of claim 1, wherein the organic semiconductor diode layer assembly comprises a layer sequence of
an n-doped electron transport layer, a hole barrier layer, an emission layer, an electron barrier layer as well as a p-doped hole transport layer.

9. Bolometer of claim 1, wherein the first and/or the second contact layer bears on the p- and/or n-conducting organic semiconductor layer such that the p- and/or n-conducting organic semiconductor layer is contacted in a full-area manner or in tracks only.

10. A bolometer with an organic semiconductor diode layer assembly for temperature measurement, the organic semiconductor diode layer assembly comprising a layer sequence of a first contact layer, a p-conducting organic semiconductor layer, an n-conducting organic semiconductor layer as well as a second contact layer,
wherein the second contact layer is connected to a first spacer and the first contact layer is connected to a second spacer, the two spacers supporting the organic semiconductor diode layer assembly above a substrate in a floating manner and being conductive in order to establish an electrical connection to an integrated circuit located within the substrate, and the organic semiconductor layers being insulated from both spacers.

11. Bolometer of claim 10, further comprising a reflective layer arranged at a given distance with respect to the semiconductor diode layer assembly.

12. Bolometer of claim 10, wherein the given distance is equal to a quarter of an infrared wavelength.

13. Bolometer of claim 10, wherein the organic semiconductor diode layer assembly is absorbent of a wavelength of electromagnetic radiation and the given distance is equal to a quarter of this wavelength.

14. Bolometer of claim 10, wherein the semiconductor diode layer assembly is suspended above a substrate in a floating manner by means of spacers.

15. Bolometer of claim 10, wherein the organic semiconductor diode layer assembly comprises a nitride layer.

16. Bolometer of claim 10, wherein the organic semiconductor diode layer assembly comprises doped organic semiconductor material.

17. Bolometer of claim 10, wherein the organic semiconductor diode layer assembly comprises a Pt black layer.

18. Bolometer of claim 10, wherein the organic semiconductor diode layer assembly comprises a layer sequence of an n-doped electron transport layer, a hole barrier layer, an emission layer, an electron barrier layer as well as a p-doped hole transport layer.

19. Bolometer of claim 10, wherein the first and/or the second contact layer bears on the p- and/or n-conducting organic semiconductor layer such that the p- and/or n-conducting organic semiconductor layer is contacted in a full-area manner or in tracks only.

* * * * *